United States Patent [19]
Kinugawa

[11] Patent Number: 4,857,986
[45] Date of Patent: Aug. 15, 1989

[54] SHORT CHANNEL CMOS ON 110 CRYSTAL PLANE

[75] Inventor: Masaaki Kinugawa, Tokyo, Japan

[73] Assignee: Kabushiki Kaisha Toshiba, Kawasaki, Japan

[21] Appl. No.: 884,962

[22] Filed: Jul. 14, 1986

[30] Foreign Application Priority Data

Oct. 17, 1985 [JP] Japan .................. 60-232253

[51] Int. Cl.$^4$ .................. H01L 27/02; H01L 29/04
[52] U.S. Cl. .................. 357/42; 357/23.1; 357/23.3; 357/60
[58] Field of Search .................. 357/60, 42, 23.1, 23.3

[56] References Cited

U.S. PATENT DOCUMENTS

| | | | |
|---|---|---|---|
| 3,476,991 | 11/1969 | Mize et al. | 357/60 |
| 3,603,848 | 9/1977 | Sato et al. | 357/60 |
| 3,634,737 | 1/1972 | Maeda et al. | 357/60 |
| 3,860,948 | 1/1975 | Ono et al. | 357/60 |
| 3,969,753 | 7/1976 | Thorsen et al. | 357/60 |
| 4,268,848 | 5/1981 | Casey et al. | 357/60 |
| 4,768,076 | 8/1988 | Aoki | 357/60 |

OTHER PUBLICATIONS

Kinagawa et al., *IEDM* Wash. D.C., Dec. 1-4, 1985, pp. 581-584.
Kohyama et al. "Directions in CMOS Technology", *Int. Elec. Dev. Meeting*, Dec. 1983, 7.1, pp. 151-154, Wash. D.C.
Sato et al., "Mobility Anisotropy of Electrons in Inversion Layers on Oxidized Silicon Surfaces," Physical Review, vol. 4, No. 6, pp. 1950-1960, Figure 2, Sep. 15, 1971.
Sato et al., "Drift Velocity Saturation of Holes in Si Inversion Layers", J. Phys. Soc. Japan (31) 1971, p. 1846.

*Primary Examiner*—Andrew J. James
*Assistant Examiner*—Jerome Jackson
*Attorney, Agent, or Firm*—Finnegan, Henderson, Farabow, Garrett, & Dunner

[57] ABSTRACT

A monocrystalline silicon substrate having a (110) crystal plane is prepared. A CMOS transistor is formed on this substrate. An N channel MOS transistor and a P channel MOS transistor are formed in the surface of the semiconductor substrate. In each of these transistors the channel length is 1.5 μm or less and the velocity saturation phenomenon of electrons is outstanding.

4 Claims, 4 Drawing Sheets

F I G. 2
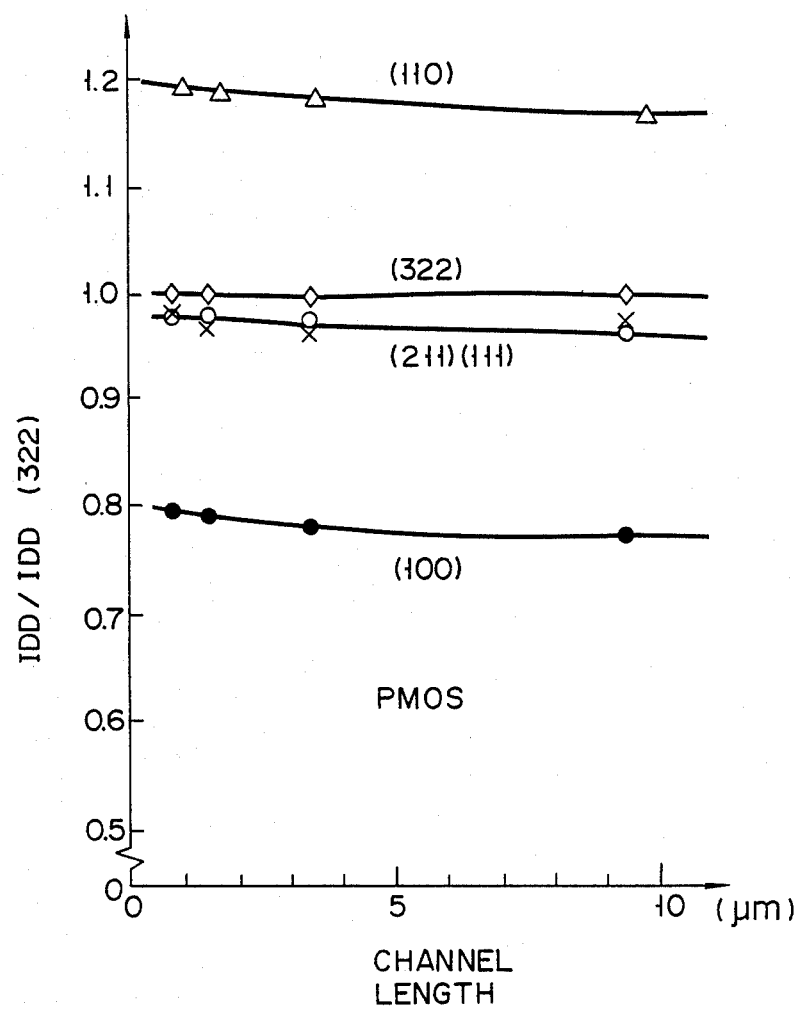

SHORT CHANNEL CMOS ON 110 CRYSTAL PLANE

BACKGROUND OF THE INVENTION

The present invention relates to an improvement in a semiconductor device of the CMOS (Complementary MOS) type.

An NMOS (N channel MOS) transistor is normally formed in the surface region of a silicon substrate having the (100) plane. This is because:

(1) The interfacial level (surface state density) between the silicon substrate and the silicon oxide film is at a minimum when the silicon substrate surface is in the (100) plane.

(2) The mobility of electrons in the (100) plane is the highest, as is disclosed in "*Mobility Anisotropy of Electrons in Inversion Layers on Oxidized Silicon Surfaces*", PHYSICAL REVIEW, Vol. 4, No. 6, 1953 p, FIG. 2. Therefore, the source-drain current of the NMOS transistor formed on the semiconductor substrate having the (100) plane provides the largest current.

Recently, the technology of CMOS transistors has advanced significantly. A CMOS transistor comprises a PMOS (P channel MOS) transistor and an NMOS transistor. The techniques applied in manufacturing NMOS transistors are also applied in the manufacture of CMOS transistors. Thus, a CMOS transistor is generally formed on the semiconductor substrate having the (100) plane. However, the mobility of holes is lowest in the (100) plane. The source-drain current provided by the PMOS transistor of this CMOS transistor is inevitably small. The PMOS transistor therefore fails to have desirable characteristics, even though the NMOS transistor of the CMOS transistor exhibits good characteristics. Consequently, the CMOS transistor, as a whole, does not have satisfactory characteristics.

CMOS transistors are also being made smaller. The smaller a CMOS transistor, the shorter its channel length. If the channel length is made too short, the velocity of electrons and the velocity of holes become saturated. It has been determined that the velocity of electrons is far more likely to be saturated than the velocity of holes. This fact becomes clear from FIGS. 1 and 2. Hence, in a CMOS made small and formed on a semiconductor substrate having a (100) plane, the advantage resulting from the NMOS transistor being formed in the (100) plane diminishes, while the disadvantage resulting from PMOS transistor being formed in the (100) plane persists. Consequently, the CMOS transistor, as a whole, still does not exhibit satisfactory characteristics.

SUMMARY OF THE INVENTION

An object of the present invention is to provide a semiconductor device of the CMOS type having improved performance.

Additional objects and advantages of the invention will be set forth in part in the description which follows, and in part will be obvious from the description, or may be learned by practice of the invention. The objects and advantages of the invention may be realized and attained by means of the instrumentalities and combination particularly pointed out in the appended claims.

To achieve the objects and in accordance with the purpose of the invention, as embodied and broadly described herein, the CMOS type semiconductor device of this invention comprises a silicon substrate having a (110) crystal plane and at least one CMOS transistor formed in the substrate, said CMOS transistor having an N channel MOS transistor which is formed on the (110) plane of the substrate and whose channel length lies within a range in which a velocity saturation phenomenon of electrons occurs, and a P channel MOS transistor formed in the silicon substrate.

With this arrangement, the output current of the N channel MOS transistor is substantially the same as that of the N channel MOS transistor formed in the semiconductor substrate having a (100) plane, due to the velocity saturation of electrons. Furthermore, the output current of the P channel MOS transistor is larger than that of the P type MOS transistor formed in the semiconductor substrate having a (100) plane. Thus, the output current of the CMOS transistor according to this invention is larger than the output current of a conventional CMOS transistor formed on the semiconductor substrate having a (100) plane. If the power consumption or output current of the CMOS transistor is equal to that of the conventional CMOS transistor, the area occupied by the elements of the CMOS transistor can be reduced. The gate parasitic capacitance and junction capacitance of the CMOS transistor are decreased due to the small size of the CMOS transistor. As a result, the speed of the transistor can be increased.

The accompanying drawings, which are incorporated in and constitute a part of this specification, illustrate one embodiment of the invention and, together with the description, serve to explain the principles of the invention.

BRIEF DESCRIPTION OF THE DRAWINGS

FIG. 2 is a graph for explaining the relationship among the crystal plane of a semiconductor substrate, the channel length of a P channel MOS transistor formed in the substrate and the source-drain current of the transistor;

DETAILED DESCRIPTION OF THE INVENTION

A CMOS type semiconductor device constructed according to an embodiment of the present invention will now be described with reference to the drawings.

Figure 1:
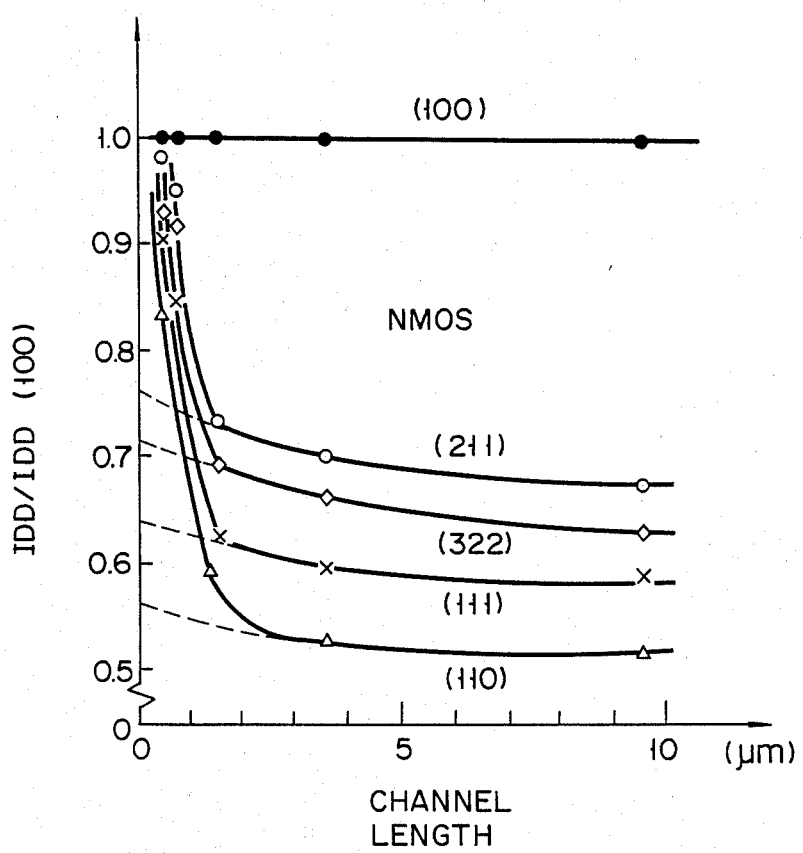
FIG. 1 is a graph for explaining the relationship among the crystal plane of a semiconductor substrate, the channel length of an N channel MOS transistor formed in the substrate, and the source-drain current of the transistor.

(1) The inventor of the present invention has found that the relationship between the crystal plane of a semiconductor substrate and the mobility of electrons in the substrate, which had conventionally been believed to exist, does not exist when the elements formed in the substrate are small. For example, in the NMOS transistor which operates at the TTL level, velocity saturation is not predictable when the effective channel length is 1.5 μm or less. The crystal plane dependency on the mobility of electrons decreases exponentially. Therefore, as shown by solid lines in FIG. 1, when the channel length is 1.5 μm (particularly, 1.0 μm) or less, the crystal plane dependency of a source-drain current of an N channel MOS transistor decreases markedly. In FIG. 1, the ratios of the output currents IDD (per unit effective channel width) of the NMOS transistor formed on semiconductor substrates of the different crystal planes to the output current IDD (100) (per unit effective channel width) of an NMOS transistor formed in a semiconductor substrate of the (100) plane are plotted on the vertical axis. The effective channel lengths of the NMOS transistors are plotted on the horizontal axis.

When VG (the voltage applied to a gate of an NMOS transistor) = VD (the voltage applied to a drain of an NMOS transistor) = 5 V and the channel length is 0.8 μm, a source-drain current per unit channel width, IDD, is 375 μA/μm in the (100) plane, 341 μA/μm in the (322) plane, 368 μA/μm in the (211) plane, 362 μA/μm in the (111) plane, and 345 μm in the (111) plane. Therefore, only a negligible difference occurs.

Hitherto, it has been believed that the relationship between the crystal plane and the output current of a transistor having an effective channel length of 1.5 μm or more is satisfactory even if the effective channel length is less than 1.5 μm, as is shown by the broken lines in FIG. 1.

On the other hand, the velocity of holes does not become readily saturated. Therefore, even if the effective channel length of the PMOS transistor is less than 1.5 μm, the mobility of holes is likely to depend on the crystal plane. As shown in FIG. 2, even if the channel of the P channel MOS transistor is 1.5 μm, the current depends upon the crystal plane. Therefore, the source-drain current of the PMOS transistor formed on the semiconductor substrate having the (100) plane is far smaller than the source-drain current of the PMOS transistor formed on the semiconductor substrate having another crystal plane, when other conditions are the same. In FIG. 2, the ratios between the output currents IDD of the PMOS transistors formed on the semiconductor substrate of different crystal planes to the output current IDD (322) of a PMOS transistor formed on a semiconductor substrate of the (322) plane are plotted on the vertical axis. The effective channel lengths of the PMOS transistors are plotted on the horizontal axis.

When $VG = VD = 5V$ and the channel length is 0.8 μm, a source-drain current per unit channel width is 185 μA/μm in the (100) plane, 301 μA/μm in the (322) plane, 297 μA/μm in the (211) plane, 298 μA/μm in the (111) plane, and 368 μA/μm in the (110) plane.

The inventor of the present invention has found that a large output current cannot be obtained from a conventional CMOS transistor having an effective channel length of the NMOS transistor of 1.5 μm or less when the semiconductor substrate uses the (100) plane. He has also found that a larger output current can be obtained by having the CMOS transistor use a semiconductor substrate having a crystal plane other than the (100) plane, particularly the (110) plane.

In other words, when the effective channel length of an NMOS transistor formed on the semiconductor substrate of a crystal plane other than the (100) plane is 1.5 μm or less, the output current of this transistor is nearly equal to the output current of an NMOS transistor formed on the semiconductor substrate of (100) plane. The output current of the PMOS transistor is larger than that of the PMOS transistor formed on the semiconductor substrate of the (100) plane. Thus, when the effective channel length of the NMOS transistor is 1.5 μm or less, the output current of a CMOS transistor formed on the semiconductor substrate of a crystal plane other than a (100) plane can be greater than that of a CMOS transistor formed on the semiconductor substrate of the (100) plane. That is, when the effective channel length of the NMOS transistor is 1.5 μm or less, the output current of the CMOS transistor whose channel is formed in a crystal plane other than a (100) plane can be larger than the output current of the CMOS transistor whose channel is formed in the (100) plane.

Assuming that both CMOS transistors have the same output current, the PMOS transistor of the CMOS transistor of this invention occupies a smaller area than the PMOS transistor of the conventional CMOS transistor. Furthermore, assuming that the conventional CMOS transistor consumes substantially the same power as a CMOS transistor formed on a semiconductor substrate of the (110) plane, the size of the PMOS transistor of the latter CMOS transistor is about two thirds of the size of the PMOS transistor of the conventional CMOS transistor.

The gate parasitic capacitance and junction parasitic capacitance of the PMOS transistor are accordingly reduced. The time which is required to charge the parasitic capacitance of the PMOS transistor of the CMOS transistor of this invention is shorter than the time which is required to charge the PMOS transistor of the conventional CMOS transistor, provided that both CMOS transistors have the same output current.

When the channel length of the N channel MOS transistor is 1.0 μm or less, the saturation of the velocity of electrons is very prominent; therefore, the invention is particularly effective. In other words, if the ratio of the current per unit channel width of the NMOS transistor formed on the substrate of the (100) plane to that of the NMOS transistor formed on the substrate of (110) plane is about 1:0.7, it is clearly advisable to form the CMOS transistor on the substrate having the (110) plane.

The interfacial level cannot be small in the MOS transistor formed on the semiconductor substrate having the (100) plane, for the following reasons. First, the number $N_{ss}$ of interfacial levels decreases due to advanced oxidation technology. Secondly, as the MOS transistor is made smaller, a gate capacitance $C_{ox}$ per unit area increases. Therefore, the influence of $\Delta V$ ($\Delta V = q \cdot N_{ss}/C_{ox}$: q is unit charges of electrons) on a threshold value of the number $N_{ss}$ of interfacial levels is reduced.

(2) On the basis of the above discussion, one embodiment of the CMOS transistor of the present invention is formed on the semiconductor substrate having a (110) plane. The channel length of the NMOS transistor of the CMOS transistor is 1.5 μm or less.

Figure 3A:
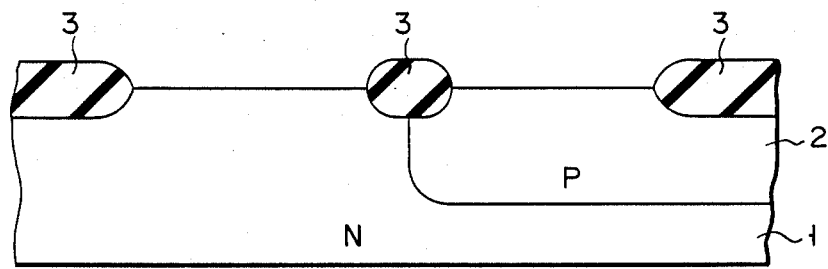
FIGS. 3A to 3C are diagrams explaining the structure of a CMOS type semiconductor device and a method of manufacturing the same, according to an embodiment of the present invention.
Figure 3B:
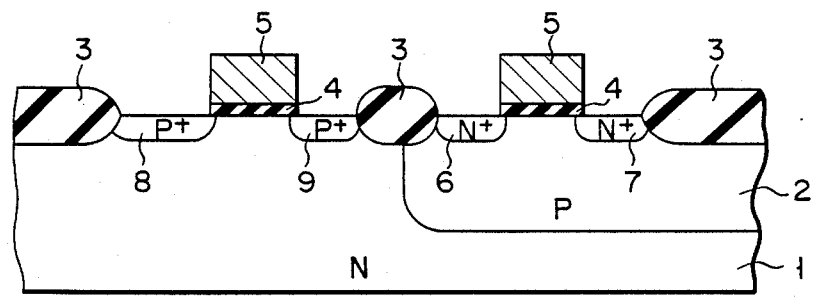

In accordance with this embodiment of the invention, a semiconductor device and its manufacturing process will now be described with reference also to FIGS. 3A–3C.

(A) An N type silicon substrate 1 having a (110) plane is prepared. Substrate 1 has a specific resistance of about 2Ω·cm. A P type well 2 having a junction depth of about 3 μm is formed in the surface area of silicon substrate 1 at a peak concentration of $2 \times 10^{16}/cm^3$. A field oxide film 3 is formed on the surface of substrate 1 by means of a selective oxidation method. The configuration shown in FIG. 3A is obtained by the above processes.

(B) A gate oxide film 4 is formed on the surfaces of semiconductor substrate 1 and P type well 2. Gate oxide film 4 is formed on the channel forming region to the thickness of, e.g., about 20 nm. The N type region, which is the region of substrate 1 other than P type well 2, is covered by resist (not shown) by lithography technology. Phosphorus ions, for example, are implanted into P well region 2 to prevent punch through, under an accelerating voltage of 280 keV and in a dosage of $6\times10^{12}/cm^2$. Further, boron ions, for example, are implanted to define the threshold value, under an accelerating voltage of 35 keV and in a dosage of about $5\times10^{12}/cm^2$. Thereafter, the resist is removed from the N type region.

P well region 2 is covered by a resist (not shown) by means of lithography technology. Ions are implanted into the N type region to prevent punch through. More specifically, boron ions, for example, are implanted into the N type region under an accelerating voltage of 80 keV and in a dosage of $6\times10^{12}/cm^2$. Further, phosphorus ions, for example, are implanted into the N type region to define the threshold value under an accelerating voltage of 35 keV and a dosage of $1\times10^{12}/cm^2$. Thereafter, the resist is removed from the P well region 2.

A polycrystalline silicon layer (not shown) having a thickness of about 400 nm is formed on the whole surface of the resultant structure by the CVD method. Phosphorus is diffused into the polycrystalline silicon layer in a $POCl_3$ atmosphere at 900° C. for 30 minutes. Thereafter, the polycrystalline silicon layer is patterned, and a gate electrode 5 consisting of polycrystalline silicon is formed. Gate electrode 5 is 1.5 μm or less long.

The N type region is covered by resist (not shown). Ions of N type impurity (for example, $BF_2+$) are implanted into P well 2, using gate electrode 5 and field oxide film 3 and the like as masks. This ion implantation is carried out under an accelerating voltage of 50 keV and in a dosage of $5\times10^{15}/cm^2$. The resist is then removed from the N type region.

The P type region is covered by resist. Ions of P type impurity (e.g., As+) are implanted into the N type region under an accelerating voltage of 50 keV and in a dosage of $5\times10^{15}/cm^2$. Thereafter, the resist is removed.

The resultant structure is annealed at 900° C. for 30 minutes in $N_2$ atmosphere. Thus, the impurities implanted into semiconductor substrate 1 and P well 2 are activated, and N+ type source and drain regions 6 and 7 are formed in P type well 2. At the same time, p+ type source and drain regions 8 and 9 are formed in substrate 1, thus forming the structure shown in FIG. 3B.

(C) Next, $SiO_2$ film 10 is deposited on the whole surface of the structure by a CVD method. Film 10 has a thickness of about 500 nm and serves as an inter-layer insulating film. The portions of film 10 which are formed on the source or drain regions 6 to 9 are removed, and contact holes 11 are formed. An Al layer (not shown) is deposited on the whole surface of the the resultant structure by a sputtering method having a thickness of about 800 nm. The Al layer is patterned, and Al electrodes and an Al wire 12 are formed. A PSG film 13 is deposited on the whole surface of the resultant structure by a CVD method. Film 13 serves as a passivation film and has a thickness of about 1.2 μm. A CMOS transistor having the cross section shown in FIG. 3C is therefore manufactured.

Figure 3C:
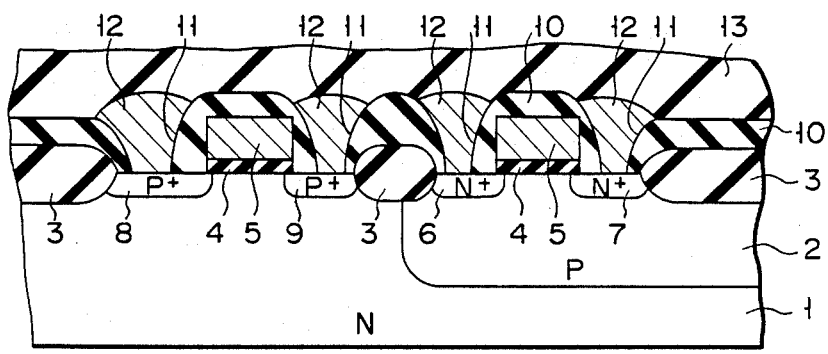

The CMOS transistor shown in FIG. 3C is formed on N type monocrystalline silicon substrate 1 having a (110) plane. Specifically, P well 2 is formed on N type monocrystalline silicon substrate 1 having the (110) plane. An NMOS transistor consisting of N. type source and drain regions 6 and 7, gate electrode 5, and the like is formed on the surface of P well 2. Further, a PMOS transistor consisting of P+type source and drain regions 8 and 9, gate electrode 5, and the like is formed in the surface region of substrate 1.

The embodiment of the CMOS transistor described above is manufactured on the silicon substrate having the (110) plane. The invention is not limited to this embodiment. As will be obvious from FIGS. 1 and 2, when the CMOS transistor is formed on a semiconductor substrate having a crystal plane other than (100), greater advantages can be obtained. Processes similar to the above-described manufacturing process are used to form CMOS transistors on semiconductor substrates having such other crystal planes.

Figure 4:
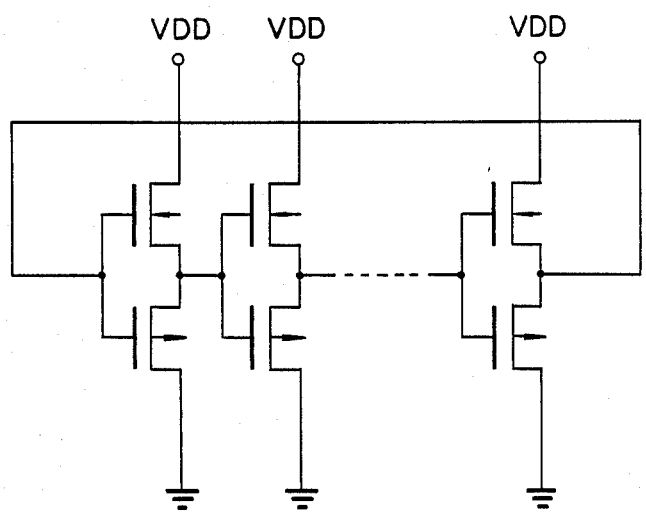
FIG. 4 is a circuit diagram of depicting an inverter circuit used to prove the advantages of the CMOS type semiconductor device constructed according to the present invention.

Experiments were performed under the following conditions to demonstrate the advantages of the CMOS transistor of the present invention. As shown in FIG. 4, a ring oscillator was manufactured having a plurality of inverters of the CMOS structure connected in series. Since the output currents of the inverters are transient, it is difficult to quantitatively determine them. Therefore, the period of time, which lapsed after the level change of the input signal of the front stage until the level change of the output signal of the inverter of the last stage, was measured. As a prerequisite, a transistor was used having the CMOS structure formed on the semiconductor substrate having the (100) plane, and it was exactly of the same size as the transistor having the CMOS structure formed on the semiconductor substrate having the (110) plane. A voltage of 5 V was applied. The channel length of the NMOS transistor was 0.8 μm, the gate width thereof was 10 μm, the channel length of the PMOS transistor was 1.0 μm, and the channel width thereof was 20 μm.

As the result of the measurement, the period of time that elapsed until an output signal was obtained was about 160 psec in the case of the inverter of the CMOS structure formed on the (100) plane. On the other hand, in the case of the inverter of the CMOS structure formed on the semiconductor substrate having the (110) plane, a signal was obtained in 130 psec. The operating time was thus improved by about 20%.

The operating speeds of the conventional transistor and the invention were compared, the electric power consumptions being constant. When the channel width of the PMOS transistor of the CMOS transistor formed on the semiconductor substrate having (100) plane was 20 μm, the channel width of the PMOS transistor of the CMOS transistor formed on the semiconductor substrate having (110) plane was 15 μm, other conditions being the same. The applied voltage was 5 V, the channel length of the NMOS transistor was 0.8 μm, the gate width was 10 μm, and the channel length of the PMOS transistor was 1.0 μm. The operating speed was 160 psec in the case of the conventional inverter, and was 130 psec in the case of the inverter of the invention. In this case as well, the operating speed was improved by about 20%.

What is claimed is:

1. A semiconductor device of a CMOS type comprising:

a silicon substrate having a (110) crystal plane; and at least one CMOS transistor formed in said substrate, each CMOS transistor having a N channel MCS transistor which is formed on said (110) plane of said substrate and whose channel length is 1.5 μm or less, and a P channel MOS transistor formed in said silicon substrate.

2. A CMOS type semiconductor device according to claim 1, wherein said substrate has a P type well region, and said N channel MOS transistor is formed in said P type well region.

3. A CMOS type semiconductor device according to claim 1, wherein the channel length of said N channel MOS transistor is 1 μm or less.

4. A CMOS type semiconductor device according to claim 1, wherein the channel length of said N channel MOS transistor is 0.8 μm.

* * * * *